United States Patent
Kobayashi

(10) Patent No.: US 9,961,813 B2
(45) Date of Patent: May 1, 2018

(54) SHIELDED CABLE

(71) Applicant: SUMITOMO ELECTRIC INDUSTRIES, LTD., Osaka-shi, Osaka (JP)

(72) Inventor: Yuto Kobayashi, Kanuma (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days. days.

(21) Appl. No.: 15/381,160

(22) Filed: Dec. 16, 2016

(65) Prior Publication Data

US 2017/0231124 A1    Aug. 10, 2017

(30) Foreign Application Priority Data

Dec. 18, 2015   (JP) .................. 2015-247578

(51) Int. Cl.
H05K 9/00    (2006.01)
H01B 11/00    (2006.01)
H01B 7/282    (2006.01)

(52) U.S. Cl.
CPC ......... H05K 9/0098 (2013.01); H01B 7/2825 (2013.01); H01B 11/002 (2013.01)

(58) Field of Classification Search
CPC ... H05K 9/0098; H01B 7/2825; H01B 11/002
USPC ...................................... 174/113 R
See application file for complete search history.

(56) References Cited

U.S. PATENT DOCUMENTS

| 6,740,808 | B1* | 5/2004 | Chang ................ | H01B 7/0861 174/113 R |
| 2011/0100682 | A1* | 5/2011 | Nonen ................ | H01B 11/203 174/254 |
| 2011/0247856 | A1* | 10/2011 | Matsuda ............. | H01B 11/203 174/108 |
| 2016/0064119 | A1 | 3/2016 | Grant et al. | |

FOREIGN PATENT DOCUMENTS

JP    2011-222262 A    11/2011

* cited by examiner

*Primary Examiner* — Timothy Thompson
*Assistant Examiner* — Charles Pizzuto
(74) *Attorney, Agent, or Firm* — Drinker Biddle & Reath LLP

(57) ABSTRACT

A shielded cable includes signal wires each having a signal conductor covered by an insulator, and a shield conductor comprising a metal foil resin tape spirally and overlappingly wrapped around the two signal wires, wherein an edge portion of the metal foil resin tape is folded back so that the metal foil therein is oriented outward, thereby bringing metal foils, which are arranged on lower and upper sides in the overlapping part of wrapping of the metal foil resin tape, into electrical contact with each other. The shielded cable includes two drain wires provided outside the metal foil resin tape and configured to be in electrical contact with an exposed part of the outwardly folded-back metal foil, which is exposed out of the overlapping part.

6 Claims, 4 Drawing Sheets

SHIELDED CABLE

CROSS-REFERENCE TO RELATED APPLICATION

The present application claims priority from Japanese Patent Application No. 2015-247578 filed on Dec. 18, 2015, the entire content of which is incorporated herein by reference.

BACKGROUND

Technical Field

The present invention relates to a shielded cable, and more particularly, to a shielded cable including signal wires each composed of a signal conductor covered with an insulator, and a shield conductor composed of a metal foil resin tape spirally and overlappingly wrapped around two signal wires.

Related Art

Shielded cables having a plurality of signal wires, for example, a pair of signal wires is used to transmit a digital signal in a differential transmission manner. The pair of signal wires is shielded by a metal foil. However, since a sufficient mechanical strength cannot be obtained by only such a metal foil, for example, a metal foil resin tape in which a metal foil is attached on a resin tape is employed. In Patent Document 1, a technique is disclosed, in which a shield conductor is wrapped to have a metal face thereof oriented outward (in a state of FIG. 2(C) in Patent Document 1) and drain wires are longitudinally arranged between the shield conductor and an outer sheath. In Patent Document 2, a shield tape is wrapped outside two electric wires and drain wires.

LITERATURE OF RELATED ART

Patent Literature

[Patent Document 1] Japanese Patent Application Publication No. 2011-222262

[Patent Document 2] US 2016/0064119

Drain wires are required to be in contact with a metal foil constituting a shield layer. If a metal foil resin tape is wrapped so that a metal foil thereof faces signal wires, drain wires have to be arranged inside the metal foil resin tape. However, in this case, there is a possibility that upon transmission of a differential signal therethrough, an amount of mode conversion from differential mode to common mode (Scd21) is increased.

SUMMARY

Exemplary embodiments of the invention provide a shielded cable in which upon transmission of a differential signal, an amount of differential mode to common mode conversion (Scd21) is small.

A shielded cable according to one aspect of the invention is a shielded cable, comprising:
  two signal wires each having a conductor and an insulator covering the conductor and aligned to be in contact and parallel with each other without being twisted;
  a shield conductor comprising a metal foil resin tape spirally and overlappingly wrapped around the two signal wires, wherein an edge portion of the metal foil resin tape is folded back so that the metal foil therein is oriented outward, thereby bringing metal foils, which are arranged on lower and upper sides in the overlapping part of wrapping of the metal foil resin tape, into electrical contact with each other; and
  two drain wires provided outside the metal foil resin tape and configured to be in electrical contact with an exposed part of the outwardly folded-back metal foil, which is exposed out of the overlapping part;
  wherein as viewed in a cross section perpendicular to a longitudinal direction of the shielded cable, the drain wires are arranged at point-symmetric positions with respect to the midpoint of a straight line drawn between center points of the signal wires.

According to the exemplary embodiments of the invention, it is possible to provide a shielded cable in which upon transmission of a differential signal therethrough, an amount of mode conversion from differential mode to common mode (Scd21) is small.

DETAILED DESCRIPTION

Description of Exemplary Embodiments of the Invention

First, exemplary embodiments of the invention will be described.

A shielded cable according to one aspect of the invention, is (1) a shielded cable, comprising:
  two signal wires each having a conductor and an insulator covering the conductor and aligned to be in contact and parallel with each other without being twisted;
  a shield conductor comprising a metal foil resin tape spirally and overlappingly wrapped around the two signal wires, wherein an edge portion of the metal foil resin tape is folded back so that the metal foil therein is oriented outward, thereby bringing metal foils, which are arranged on lower and upper sides in the overlapping part of wrapping of the metal foil resin tape, into electrical contact with each other; and
  two drain wires provided outside the metal foil resin tape and configured to be in electrical contact with an exposed part of the outwardly folded-back metal foil, which is exposed out of the overlapping part;
  wherein the drain wires are arranged at point-symmetric positions with respect to the midpoint of a straight line drawn between center points of the signal wires as viewed in a cross section perpendicular to a longitudinal direction of the shielded cable.

(2) The drain wires are placed on the straight line as viewed in the cross section perpendicular to the longitudinal direction of the shielded cable. (3) The drain wires are respectively arranged above and below a location, where the two signal wires are in contact with each other, as viewed in the cross section perpendicular to the longitudinal direction of the shielded cable. (4) The shielded cable further comprises an outer sheath around the shield conductor.

Details of Exemplary Embodiments of the Invention

Figure 1:
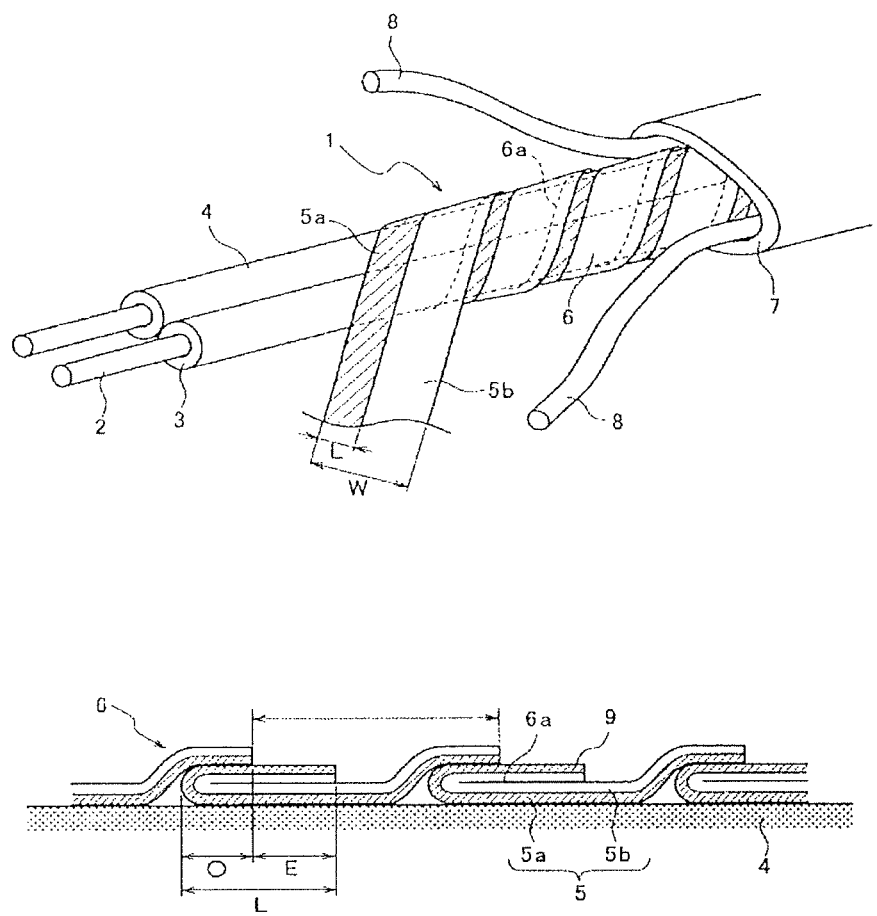
FIG. 1 is a schematic view explaining a shielded cable according to one aspect of the invention.

The exemplary embodiments of the invention will be described in detail with reference to the drawings. FIG. 1 is a schematic view explaining a shielded cable according to one aspect of the invention. The shielded cable 1 shown in FIG. 1 is, for example, a Twinax cable and has a metal foil resin tape 5 spirally wrapped around a parallel pair of signal wires 4, in which two signal wires are aligned to be in contact and parallel with each other. Preferably, two signal wires are aligned to be parallel with each other without being twisted. In the case where two signal wires are not twisted, when signals are transmitted through the cable, attenuation of signals in a high frequency range is not sharply increased, as compared with the case where signal wires are twisted. Therefore, the cable in which two signal wires are aligned to be in contact and parallel with each other without being twisted is suitable to transmit high frequency signals.

The signal wire 4 is composed of a signal conductor 2 covered with an insulator 3. The signal conductor 2 is formed of a single wire of a good electrical conductor, such as copper and aluminum, or a tin-plated or silver-plated good electrical conductor, or of a twisted wire obtained by twisting good electrical conductors with each other. As the signal conductor 2, a wire material corresponding to AWG 20 to 36 (an outer diameter of a conductor is 0.115 mm to 0.910 mm) is employed. As the insulator 3, a material having a low dielectric constant is employed. For example, polyethylene (PE), ethylene-vinyl acetate (EVA) copolymer, fluorine resin and the like are employed. Alternatively, a foamed insulating resin may be employed. An outer diameter of the signal wires 4 is about 3.0 mm to 0.15 mm. For example, when the signal conductor 2 of AWG 26 is employed, an outer diameter of the signal wires 4 is about 1.25 mm.

The two signal wires 4 are covered with a shield conductor 6. Specifically, the shield conductor 6 is formed by spirally wrapping a metal foil resin tape 5 and is configured to shield the two signal wires 4 together. As shown in FIG. 1, the metal foil resin tape 5 is formed by bonding a metal foil 5a, such as copper and aluminum, to a resin tape 5b, such as polyethylene terephthalate (PET). A thickness of the metal foil 5a is 3 μm to 30 μm (preferably, in the case of copper, 6 to 10 μm, for example, 8 μm), a thickness of the resin tape 5b is 3 μm to 50 μm (preferably, in the case of PET, 3 to 10 μm, for example, 4 μm), and a thickness of the metal foil resin tape 5 is 6 μm to 80 μm.

The shield conductor 6 may be covered with an outer sheath 7. In this case, the outer sheath 7 is provided by extruding a thermoplastic resin, such as polyethylene, polyvinyl chloride and fluorine resin. Alternatively, the outer sheath may be provided by wrapping a resin tape, such as PET. If the outer sheath 7 is provided, it is possible to electrically insulate the metal foil resin tape 5, to prevent contamination from the exterior, and also to provide a waterproof cable.

Herein, the metal foil resin tape 5 is overlappingly wrapped at an angle of 8° to 70° relative to an axis perpendicular to a longitudinal direction of the cable. In the overlapping part of wrapping, metal foils 5a arranged on lower and upper sides are in electrical contact with each other. Specifically, as shown in FIG. 1, a folded-back portion 6a is formed at one edge portion of the metal foil resin tape 5, and the metal foil 5a on the folded-back portion 6a is arranged on an outer side of wrapping. Accordingly, the metal foil resin tape 5 is wrapped around outer peripheries of the signal wires 4, so that the metal foil 5a, except those in the folded-back portion 6a, is arranged on an inner side. At this time, the metal foil 5a on the folded-back portion 6a overlaps with the metal foil 5a provided on an edge portion of the next turn, which has no folded-back portion 6a. The metal foil 5a on a lower side overlaps with the metal foil 5a on an upper side while being partially exposed out thereof. Thus, the metal foils 5a arranged on the lower and upper sides are in electrical contact with each other. Thereby, a shield current is allowed to linearly flow parallel with the signal wires 4, thereby reducing a suck-out phenomenon. Herein, the suck-out phenomenon means that attenuation of a signal having a specific frequency is sharply increased.

A width L of the folded-back portion 6a is preferably about ⅕ or more of a wrapping width W of the metal foil resin tape 5 and less than W. For example, in the case of the metal foil resin tape 5 having a width of 7 mm, the folded-back portion 6a is folded back to have a width L of 1.1 to 3.5 mm and thus a wrapping width W of the tape 5 is set to 3.5 to 5.9 mm. Also, if the width L of the folded-back portion 6a is smaller, electrical conduction of the metal foils 5a at the overlapping part O may not be sufficient, and also a width E of the exposed portion 9 of the metal foil 5a and electrical conduction thereof to drain wires may be not sufficient. On the other hand, if the width L of the folded-back portion 6a is excessively larger, the metal foil resin tape 5 may be wasted and wrapping thereof may be disturbed. The width L of the folded-back portion 6a is set to 1.8 to 2 mm and thus the width E of the exposed portion 9 of the metal foil 5a is set to 0.5 to 7 mm.

Further, a wrapping member (not shown) may be spirally wrapped around the metal foil resin tape 5. The wrapping member may be a resin tape, such as PET, and can protect the metal foil resin tape 5. Also, as shown in FIG. 1, two drain wires 8 are provided between the shield conductor 6 and an outer sheath 7. In this case, each drain wire 8 is electrically communicated with the metal foil 5a on the lower side, which is folded back to be exposed to the outside.

Figure 2:
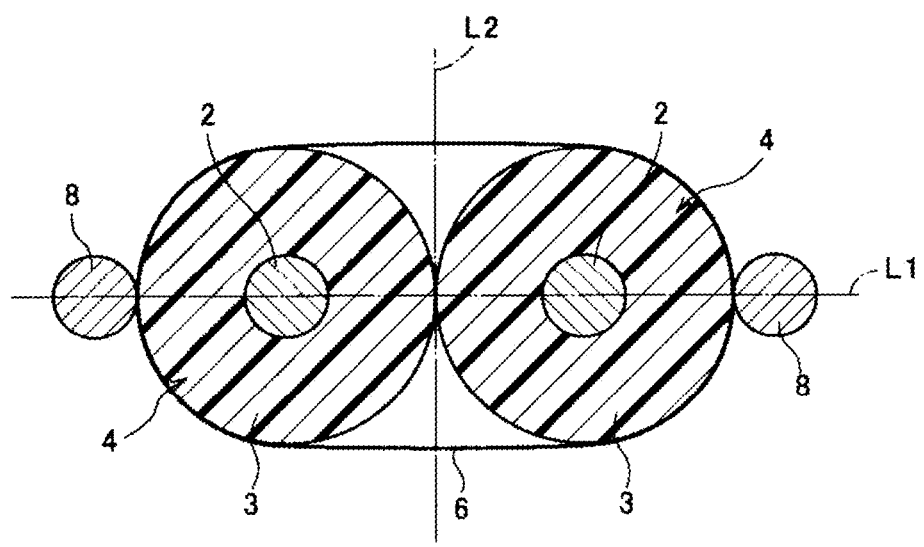
FIG. 2 is a view explaining an example of structure of the shielded cable of FIG. 1.

FIG. 2 is a view explaining an example of structure of the shielded cable of FIG. 1. Herein, the outer sheath described in FIG. 1 is not shown. The drain wires 8 are respectively positioned on both sides of the parallel pair of signal wires 4, which are in contact with each other. As viewed in a cross section perpendicular to the longitudinal direction of the shielded cable, the drain wires 8 shown in FIG. 2 are preferably placed on a straight line L1 drawn between center points of the signal conductors 2 and the drain wires are in contact with the metal foil 5a. More preferably, center points of the drain wires 8 are placed on the straight line L1.

Since the metal foil 5a is in contact with the signal wires 4, a dielectric constant inside the shield layer (metal foil) can be prevented from varying along the longitudinal direction. Accordingly, an impedance is stabilized and an insertion loss (an amount of attenuation) is not increased. When the drain wires are arranged on both sides of the parallel pair of signal wires 4, wrapping of the shield conductor 6 on upper and lower sides of a location, where the signal wires 4 are in contact with each other, can be longitudinally stabilized and thus the dielectric constant inside the shield layer can be also stabilized. As a result, a cable having a small insertion loss can be stably obtained. In addition, when two drain wires 8 are arranged at symmetric positions, insulators of the signal wires are similarly pressed and thus prevented from becoming asymmetric, thereby further enhancing stability.

For a structure in which drain wires are arranged inside a shield conductor (hereinafter, referred to as Sample 1), a structure in which one drain wire is arranged outside a shield conductor (hereinafter, referred to as Sample 2) and a structure in which as described in FIG. 2, two drain wires are arranged at symmetric positions outside a shield conductor (hereinafter, referred to as Sample 3), an amount of mode conversion (Scd21) was analyzed. Meanwhile, Scd21 means a conversion amount of differential mode to common mode, from a port 1 to a port 2, and is one of mixed-mode S-parameters. In a compliance test of USB cables (e.g., USB 3.0), Scd21 value is set to −20 dB/m or lower.

In Sample 1, a percentage of a value of −20 dB/m or more was smaller than 30% and thus an amount of mode conversion was increased. Also, in Sample 2, a percentage of a value of −20 dB/m or more was smaller than 10% and thus an amount of mode conversion was slightly increased. Contrarily, in Sample 3, in which two drain wires are arranged at symmetric positions, a percentage of a value of −20 dB/m or more was smaller than 5% and thus an amount of mode conversion was reduced. In other words, it could be found that it is also possible to reduce a phase shift caused by mode conversion and thus to reduce a skew.

If two drain wires are arranged at symmetric positions as in Sample 3, the shield conductor are also symmetrically deformed at locations where each of drain wires is positioned. Therefore, an electric field strength distribution in the insulator is also not disturbed, thereby decreasing EMI (Electromagnetic Interference) radiation.

Figure 3:
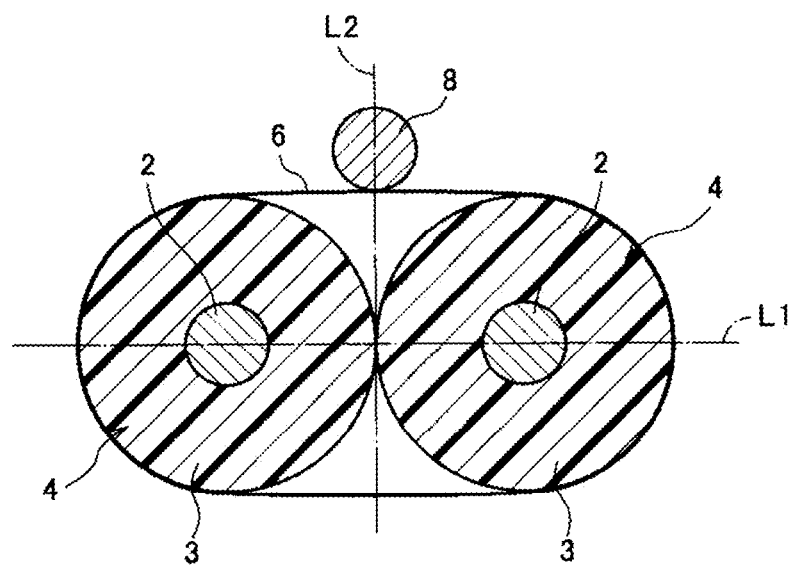
FIG. 3 is a view explaining another example of structure of the shielded cable.

FIG. 3 is a view explaining another example of structure of a shielded cable. An outer sheath is also not shown in this figure. As viewed in a cross section of the shielded cable as in FIG. 2, a drain wire 8 shown in FIG. 3 is positioned above (or below) a contact location of signal wires 4. In the case where one drain wire is arranged, it is preferable that the drain wire is arranged at such a position, because the cable can have a good symmetry and an insertion loss can be easily stabilized.

Figure 4:
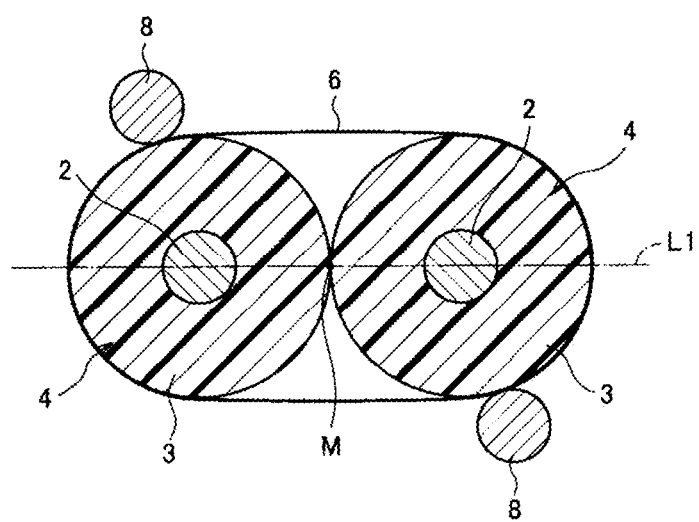
FIG. 4 is a view explaining further another example of structure of the shielded cable.

FIG. 4 is a view explaining further another example of structure of a shielded cable. An outer sheath is also not shown in this figure. As viewed in a cross section of the shielded cable as in FIG. 2, center points of drain wires 8 shown in FIG. 4 may be arranged at point-symmetric positions with respect to the midpoint (also referred to as the center of symmetry) M of a straight line L drawn between center points of signal conductors 2, i.e., at positions which coincide with each other if being rotated about the midpoint M by 180°.

Figure 5:
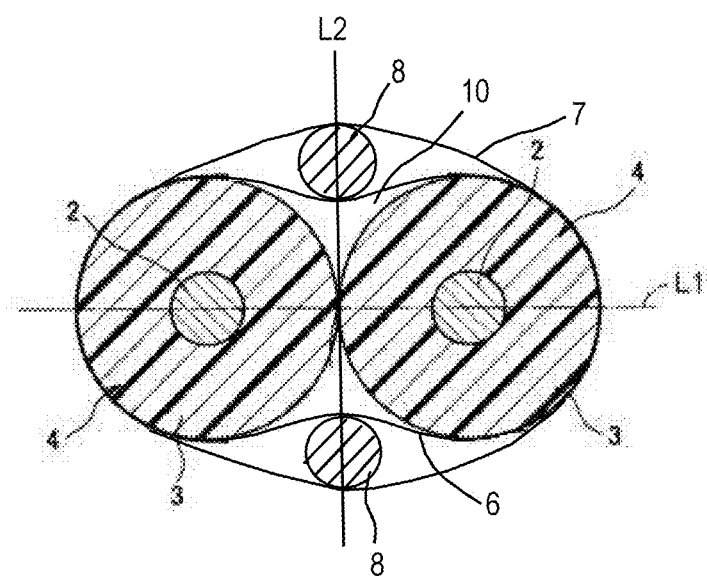
FIG. 5 is a view explaining further another example of structure of the shielded cable.

FIG. 5 is a view explaining further another example of structure of a shielded cable. This is an example of the shielded cable shown in FIG. 4 and combines advantages of the shielded cable shown in FIG. 4 and the shielded cable shown in FIG. 3. This shielded cable is preferably configured so that in a cross section perpendicular to a longitudinal direction of the shielded cable, two drain wires are respectively arranged above and below a contact location of signal wires 4 (i.e., on a straight line L2 extending through the contact location and perpendicular to a straight line L1 drawn between center points of the signal conductors 2). Since the drain wires are arranged outside the shield conductors and thus a distance between the shield conductor and the signal wires is kept consistent in longitudinal and lateral directions of the cable, an amount of mode conversion from differential mode to common mode (Scd21) when a signal is transmitted through the cable is small. Also, since the drain wires are arranged in a good symmetry, an insertion loss of a signal transmitted through the cable is stabilized. Accordingly, a good signal transmission can be achieved.

If the shield conductor 6 and the drain wires 8 are covered with an outer sheath 7 (e.g., wrapped with a PET tape), the drain wires 8 are pressed by the outer sheath 7 and thus the shield conductor 6 slightly drops into a space 10 defined along an outer shape of the signal wires. At this time, the drain wires 8 are only slightly moved in a thickness direction of the cable along the straight line L2, but not moved in a lateral direction of the cable (a direction parallel to the straight line L1). As a result, the symmetry in arrangement of the two drain wires 8 does not collapse. The insertion loss of a signal transmitted through the cable is further stabilized, as compared with the case of the cable shown in FIG. 4.

In the cases of a structure in which as described in FIG. 2, two drain wires are arranged at line-symmetric positions outside a shield conductor (hereinafter, referred to as Sample 4), a structure in which as described in FIG. 4, two drain wires are arranged at point-symmetric positions outside a shield conductor (hereinafter, referred to as Sample 5) and a structure in which as described in FIG. 5, two drain wires are arranged outside a shield conductor and at point-symmetric positions located above and below a contact location of signal wires 4 (hereinafter, referred to as Sample 6), a percentage of a Scd21 value of −20 dB/m or more was smaller than 5% and thus an amount of mode conversion was reduced. Although for each of Samples, the drain wires have been described by way of example as having a circular shape as viewed in a cross section, the invention is not limited to the circular shape. For example, drain wires of Samples 1 to 3, 5 and 6 may have a circular arc shape as viewed in a cross section, and also drain wires of Samples 1, 2, 4, 5 and 6 may have a flat plate shape as viewed in a cross section. As examples of a structure in which drain wires are arranged outside a shield layer, there is also a structure in which a metal foil resin tape is wrapped so that a metal foil is oriented outward and a resin tape is oriented inward. In such a structure, the metal foil resin tape is wrapped so that the resin tape is brought into contact with signal wires and thus the resin tape is positioned between the signal wires and the metal foil. Contrarily, according to the invention, the metal foil resin tape is wrapped so that the metal foil is brought into contact with the signal wires. This is preferable because an impedance of the cable is stabilized and attenuation of a signal transmitted through the cable is reduced.

It should be noted that the above exemplary embodiments are just exemplary in all aspects and are not limitative. The scope of the invention is defined in the claims, not the above descriptions, and is intended to encompass the equivalents to the claims and all changes that can be made without departing from the scope of the invention.

What is claimed is:
1. A shielded cable, comprising:
two signal wires each having a conductor and an insulator covering the conductor and aligned to be in contact and parallel with each other without being twisted;
a shield conductor comprising a metal foil resin tape spirally and overlappingly wrapped around the two signal wires, wherein an edge portion of the metal foil resin tape is folded back so that the metal foil therein is oriented outward, thereby bringing metal foils, which are arranged on lower and upper sides in the overlapping part of wrapping of the metal foil resin tape, into electrical contact with each other; and two drain wires provided outside the metal foil resin tape and configured to be in electrical contact with an exposed part of the outwardly folded-back metal foil, which is exposed out of the overlapping part;

wherein as viewed in a cross section perpendicular to a longitudinal direction of the shielded cable, the drain wires are arranged at point-symmetric positions with respect to a midpoint of a straight line drawn between center points of the signal wires.

2. The shielded cable according to claim 1, wherein the drain wires are placed on the straight line as viewed in the cross section perpendicular to the longitudinal direction of the shielded cable.

3. The shielded cable according to claim 2, wherein the drain wires are respectively arranged above and below a location, where the two signal wires are in contact with each other, as viewed in the cross section perpendicular to the longitudinal direction of the shielded cable.

4. The shielded cable according to claim 1, further comprising:

an outer sheath around the shield conductor.

5. The shielded cable according to claim 2, further comprising:

an outer sheath around the shield conductor.

6. The shielded cable according to claim 3, further comprising:

an outer sheath around the shield conductor.

* * * * *